United States Patent
Thean et al.

(10) Patent No.: US 7,821,067 B2
(45) Date of Patent: Oct. 26, 2010

(54) ELECTRONIC DEVICES INCLUDING A SEMICONDUCTOR LAYER

(75) Inventors: Voon-Yew Thean, Austin, TX (US); Brian J. Goolsby, Austin, TX (US); Linda B. McCormick, Dripping Springs, TX (US); Bich-Yen Nguyen, Austin, TX (US); Colita M. Parker, Austin, TX (US); Mariam G. Sadaka, Austin, TX (US); Victor H. Vartanian, Dripping Springs, TX (US); Ted R. White, Austin, TX (US); Melissa O. Zavala, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 314 days.

(21) Appl. No.: 11/836,844

(22) Filed: Aug. 10, 2007

(65) Prior Publication Data
US 2007/0272952 A1    Nov. 29, 2007

Related U.S. Application Data

(62) Division of application No. 11/273,092, filed on Nov. 14, 2005, now Pat. No. 7,265,004.

(51) Int. Cl.
 *H01L 21/84* (2006.01)
(52) U.S. Cl. ............................. 257/347; 257/E21.561
(58) Field of Classification Search ......... 257/347–354, 257/E21.561
See application file for complete search history.

(56) References Cited

U.S. PATENT DOCUMENTS

| | | | |
|---|---|---|---|
| 6,326,667 B1 * | 12/2001 | Sugiyama et al. | ............ 257/347 |
| 6,369,438 B1 | 4/2002 | Sugiyama et al. | |
| 6,458,662 B1 | 10/2002 | Yu | |
| 6,774,390 B2 | 8/2004 | Sugiyama et al. | |
| 6,936,516 B1 | 8/2005 | Goo et al. | |
| 7,029,980 B2 | 4/2006 | Liu et al. | |
| 7,056,773 B2 | 6/2006 | Bryant et al. | |
| 7,056,778 B2 | 6/2006 | Liu et al. | |
| 7,208,357 B2 | 4/2007 | Sadaka et al. | |

(Continued)

OTHER PUBLICATIONS

Lim, Y.S, et al. "Dry Thermal Oxidation of a Graded SiGe Layer," Applied Physics Letters, v. 79, No. 22; Nov. 26, 2001; pp. 3606-3608.

(Continued)

*Primary Examiner*—Richard A. Booth (57) ABSTRACT

An electronic device can include a first semiconductor portion and a second semiconductor portion, wherein the compositions of the first and second semiconductor portions are different from each other. In one embodiment, the first and second semiconductor portions can have different stresses compared to each other. In one embodiment, the electronic device may be formed by forming an oxidation mask over the first semiconductor portion. A second semiconductor layer can be formed over the second semiconductor portion of the first semiconductor layer and have a different composition compared to the first semiconductor layer. An oxidation can be performed, and a concentration of a semiconductor element (e.g., germanium) within the second portion of the first semiconductor layer can be increased. In another embodiment, a selective condensation may be performed, and a field isolation region can be formed between the first and second portions of the first semiconductor layer.

20 Claims, 4 Drawing Sheets

U.S. PATENT DOCUMENTS

| | | | |
|---|---|---|---|
| 7,217,603 | B2 | 5/2007 | Currie et al. |
| 2004/0140479 | A1 | 7/2004 | Akatsu |
| 2005/0093154 | A1 | 5/2005 | Kottantharayil et al. |
| 2005/0245092 | A1 | 11/2005 | Orlowski et al. |
| 2005/0272186 | A1 | 12/2005 | Chu |
| 2005/0272188 | A1* | 12/2005 | Yeo et al. .................. 438/154 |
| 2006/0042542 | A1 | 3/2006 | Bedell et al. |
| 2006/0242542 | A1 | 10/2006 | English et al. |

OTHER PUBLICATIONS

Tezuka, Tsutomu, et al., "Selctively-formed High Mobility SiGe-on-Insulator pMOSFETs with Ge-rich Strained Surface Channels Using Local Condensation Technique," IEEE 2004 Symposium on VLSI Technology Digest of Technical Papers, 2004, pp. 198-199.

Tezuka, Tsutomu, et al., "Fabrication of Strained Si on an Ultrathin SiGe-on-insualtor Virtual Substrate with a High-Ge Fraction," Applied Physics Letters, v. 79, No. 12, Sep. 17, 2001, pp. 1798-1800.

Okano et al., "Process Integration Technology and Device Characteristics of CMOS FinFET on Bulk Silicon Substrate with sub-10nm Fin Width and 20nm Gate Length", IEEE, 2005, 4 pgs.

Sawano et al. "Relaxation Enhancement of SiGe Thin Layers by Ion Implantation in Si Substrates", IEEE, 2002, pp. 403-404.

Vyatkin et al., "Ion Beam Induced Strain Relaxation in Pseudomorphous Epitaxial SiGe Layers", IEEE, 2000, pp. 70-72.

U.S. Appl. No. 11/428,038, filed Jun. 30, 2006, Inventor: Marius Orlowski.

U.S. Appl. No. 12/605,556, filed Oct. 26, 2009, Inventor: Marius Orlowski.

PCT/US2007/067291 International Search Report and Written Opinion mailed Oct. 31, 2007 in PCT Application corresponding to U.S. Appl. 11/428,038.

Office Action mailed Mar. 6, 2009 in Related U.S. Appl. No. 11/428,038.

Notice of Allowance mailed Jul. 24, 2009 in Related U.S. Appl. No. 11/428,038.

* cited by examiner

ELECTRONIC DEVICES INCLUDING A SEMICONDUCTOR LAYER

CROSS-REFERENCE TO RELATED APPLICATION

This is a divisional application of and claims priority under 35 U.S.C. §120 to U.S. patent application Ser. No. 11/273,092 entitled "Electronic Devices Including a Semiconductor Layer and a Process For Forming The Same," by Thean et al., filed Nov. 14, 2005, which is assigned to the current assignee hereof and incorporated herein by reference in its entirety.

BACKGROUND

1. Field of the Disclosure

The present disclosure relates to electronic devices and processes for forming them, and more particularly to electronic devices including semiconductor layers and processes for forming the same.

2. Description of the Related Art

Integration of n-channel and p-channel transistors into electronic devices, such as integrated circuits, is becoming more difficult as device performance becomes more demanding. Active regions of n-channel transistors may be fabricated within silicon, and active regions of p-channel transistors may be fabricated within silicon germanium. In addition, gate dielectric layers and gate electrodes may also have different compositions to further enhance device performance.

Carrier mobility enhancement through stress and strain engineering in semiconductor devices is an approach to improve performance of aggressively-scaled semiconductor devices. However, n-channel and p-channel transistors may need different forms of stress and strain to achieve enhanced mobility. Improved circuit performance may require the co-integration of different stress and strain for n-channel and p-channel transistors.

BRIEF DESCRIPTION OF THE DRAWINGS

Embodiments are illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments.

DETAILED DESCRIPTION

An electronic device can include a first semiconductor portion and a second semiconductor portion, wherein the compositions of the first and second semiconductor portions are different from each other. In one embodiment, the electronic device can include a substrate and an insulating layer overlying the substrate. The first and second semiconductor portions may overlie the insulating layer and have different stresses compared to each other. In a particular embodiment, different types of electronic components (e.g., n-channel transistors and p-channel transistors) may be formed at least partially within the different semiconductor portions. For example, an n-channel transistor may be formed within the first semiconductor portion, and a p-channel transistor may be formed within the second semiconductor portion.

Processes for forming the electronic device can be varied and still achieve the electronic device have different semiconductor portions. In one embodiment, an oxidation mask can be formed over a first semiconductor layer that includes the first and second semiconductor portions. In a particular embodiment, the first semiconductor layer has a substantially uniform composition, as initially formed. A second semiconductor layer can be formed over the second semiconductor portion of the first semiconductor layer and have a different composition compared to the first semiconductor layer. An oxidation can be performed, and a concentration of a semiconductor element (e.g., germanium) within the second portion of the first semiconductor layer can be increased.

In another embodiment, a selective condensation can be performed, so that the concentration of a semiconductor element is increased within the second portion of the first semiconductor layer. A third portion of the first semiconductor layer may lie between first and second portions of the first semiconductor layer. The third portion can be removed and field isolation region be formed at a region where the third portion was removed.

Before addressing details of embodiments described below, some terms are defined or clarified. Group numbers corresponding to columns within the Periodic Table of the elements use the "New Notation" convention as seen in the *CRC Handbook of Chemistry and Physics*, 81$^{st}$ Edition (2000).

The term "semiconductor element" is intended to mean an element by itself or in combination with one or more elements that form a semiconductor. For Group 14 semiconductors, semiconductor elements include Si, Ge, and C, but do not include Group 13 or Group 15 elements. Such Group 13 or Group 15 elements within a Group 14 semiconductor would be dopants that affect the conductivity and other electronic characteristics of the Group 14 semiconductor. For III-V semiconductors, semiconductor elements include Group 13 and Group 15 elements, but do not include Group 14 elements. Similarly, for II-VI semiconductors, semiconductor elements include Group 2, Group 12 and Group 16 elements, but do not include Group 13, Group 14, or Group 15 elements.

The term "substrate" is intended to mean a base material. An example of a substrate includes a quartz plate, a monocrystalline semiconductor wafer, a semiconductor-on-insulator wafer, etc. The reference point for a substrate is the beginning point of a process sequence.

The term "workpiece" is intended to mean a substrate and, if any, one or more layers, one or more structures, or any combination thereof attached to the substrate, at any particular point of a process sequence. Note that the substrate may not significantly change during a process sequence, whereas the workpiece significantly changes during the process sequence. For example, at the beginning of a process sequence, the substrate and workpiece are the same. After a layer is formed over the substrate, the substrate has not changed, but now the workpiece includes the combination of the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 1:
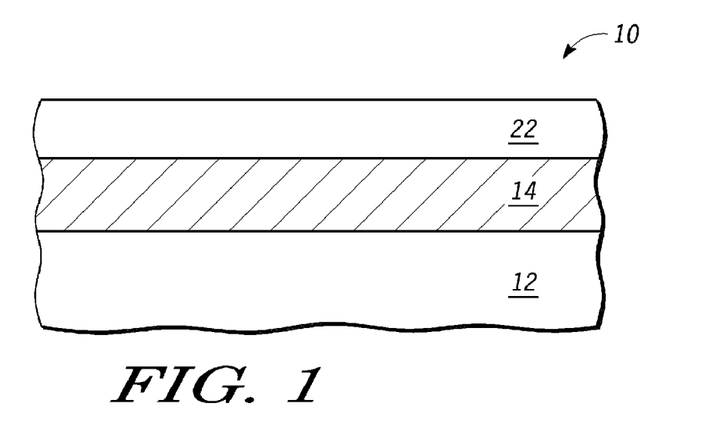
FIG. 1 includes an illustration of a cross-sectional view of a portion of a workpiece that includes a substrate, an insulating layer, and a semiconductor layer.

FIG. 1 includes an illustration of a cross-sectional view of an electronic device workpiece 10, which includes a substrate 12, an insulating layer 14, and a semiconductor layer 22. The substrate 12 can include an electronic device substrate, such as a flat panel substrate, a semiconductor device substrate, or the other conventional substrate used for forming electronic devices. In one embodiment, the substrate 12 is a substantially monocrystalline semiconductor material, such as silicon. The substrate 12 could include one or more other materials that can be used in place of or in conjunction with silicon. The insulating layer 14 overlies the substrate 12. The insulating layer 14 includes an oxide, nitride, or a combination thereof. The insulating layer 14 (which in one embodiment is referred to as a buried oxide or BOX) has a thickness sufficient to substantially reduce parasitic capacitance between the substrate 12 and subsequently formed electronic devices within the semiconductor layer 22. In one embodiment, the insulating layer 14 has a thickness of at least 100 nm.

The semiconductor layer 22 can have a tensile stress of at least approximately one gigapascal (GPa). The semiconductor layer 22 can include one or more Group 14 elements, such as C, Si, Ge, or other appropriate material, and in one embodiment, the semiconductor layer 22 is a substantially monocrystalline silicon layer. The semiconductor layer 22 may or may not include an n-type dopant or a p-type dopant. The thickness of the semiconductor layer 22 is in a range of approximately 10 to approximately 100 nm. In a particular embodiment, the semiconductor layer 22 has a thickness of approximately 40 to approximately 70 nm. The electronic device workpiece 10 can be obtained as a SOITEC Smart-Cut™ brand substrate available from EV Group Inc. of Tempe, Ariz., U.S.A.

After the semiconductor layer 22 is deposited, the semiconductor layer 22 has at least approximately one GPa. Thus, fully or partially depleted transistors can be formed using the semiconductor layer 22.

Figure 2:
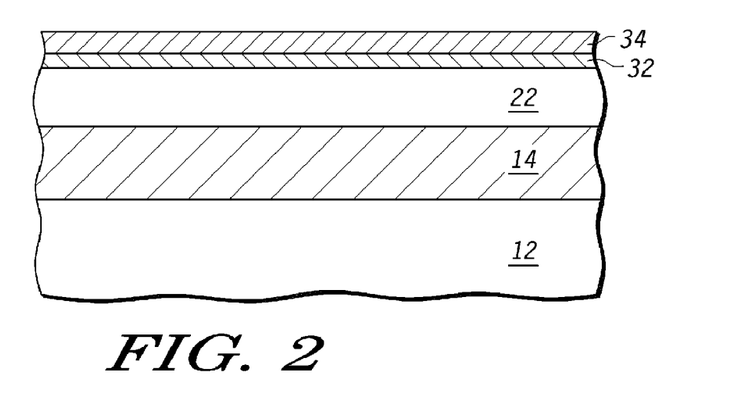
FIG. 2 includes an illustration of a cross-sectional view of the workpiece of FIG. 1 after forming a pad layer and an oxidation-resistant layer.

A pad layer 32 and an oxidation-resistant layer 34 are formed over the semiconductor layer 22, as illustrated in FIG. 2. In one embodiment, the pad layer 32 includes an oxide (e.g., silicon dioxide) that is grown or deposited over the semiconductor layer 22, and the oxidation-resistant layer 34 includes a nitride (e.g., silicon nitride) that is deposited over the pad layer 32. In one non-limiting embodiment, the pad layer 32 can have a thickness in a range of approximately 5 to approximately 20 nm, and the oxidation-resistant layer 34 can have a thickness in a range of approximately 10 to 100 nm.

Figure 3:
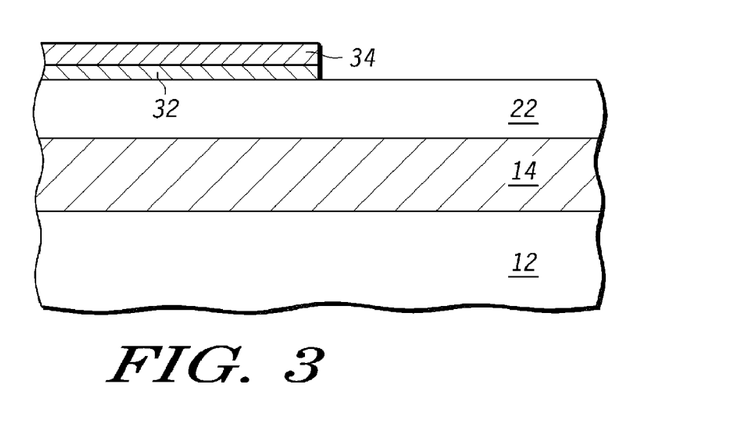
FIG. 3 includes an illustration of a cross-sectional view of the workpiece of FIG. 2 after patterning the pad layer and the oxidation-resistant layer.

The pad layer 32 and the oxidation-resistant layer 34 can be patterned, as illustrated in FIG. 3, using a conventional lithographic and etch techniques. The remaining portions of the pad layer 32 and oxidation-resistant layer 34 protect underlying portions of the semiconductor layer 22 from contacting a subsequently formed semiconductor layer. The remaining portion of the oxidation-resistant layer 34 can act as an oxidation mask during a subsequent oxidation.

Figure 4:
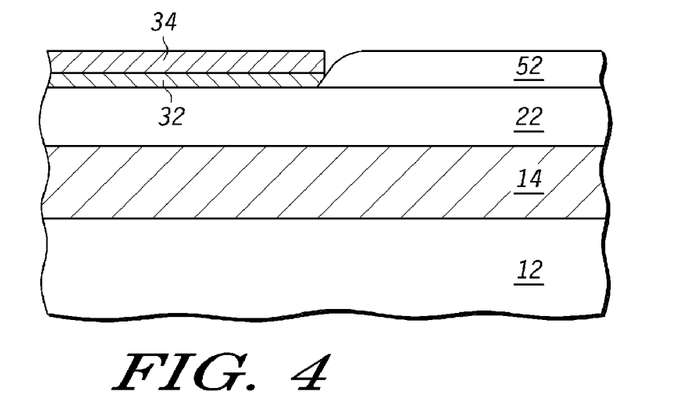
FIG. 4 includes an illustration of a cross-sectional view of the workpiece of FIG. 3 after selectively forming another semiconductor layer over a portion of the semiconductor layer.

A semiconductor layer 52 is formed by growing the semiconductor layer 52, using a selective epitaxy technique, from the exposed portions of the semiconductor layer 22, as illustrated in FIG. 4. In one embodiment, the selective epitaxy is performed at a temperature in a range of approximately 600 to approximately 800° C. The semiconductor layer 52 has at least one semiconductor element different from the semiconductor layer 22. The germanium content and thickness of the semiconductor layer 52 can depend on the final germanium content desired for active regions of the p-channel transistors. In one embodiment, the semiconductor layer 52 is a silicon germanium layer that has approximately 10 to approximately 40 atomic % germanium. The thickness of the semiconductor layer 52 is in a range of approximately 10 to approximately 100 nm.

Figure 5:
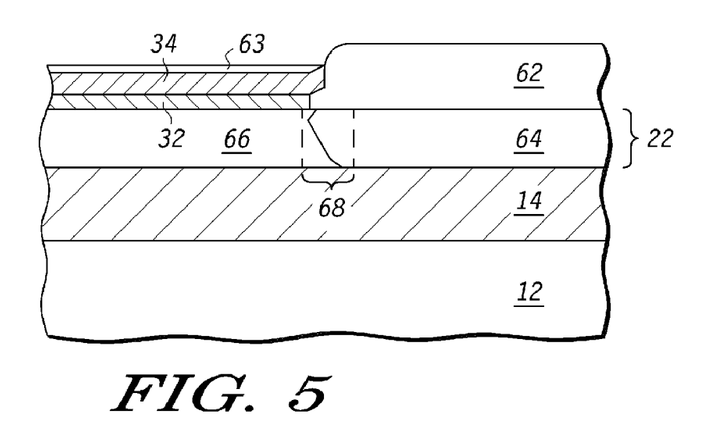
FIG. 5 includes an illustration of a cross-sectional view of the workpiece of FIG. 4 after oxidizing at least a portion of the selectively-formed semiconductor layer.

At least a portion of the semiconductor layer 52 is oxidized to form an oxide layer 62 and condense germanium within the semiconductor layer 22. During the oxidation, none or only a portion of the semiconductor layer 22 under the semiconductor layer 52 is oxidized. Any portion of the semiconductor layer 52, if any, that remains after the oxidation, is removed, as illustrated in FIG. 5. A small portion of the oxidation-resistant layer 34 may be oxidized to form an oxynitride layer 63.

The oxidation can be performed at a temperature in a range of approximately 900 to approximately 1000° C. The time of the oxidation and thickness of the oxide formed depends in part on the final thickness of the remaining portions of the semiconductor layer 22 and semiconductor layer 52. In one embodiment, approximately 5 nm to approximately 50 nm of the combined thickness of the semiconductor layer 22 and semiconductor layer 52 is consumed by the oxidation.

Silicon within the semiconductor layer 52 is consumed by the oxidation, and the remaining part of semiconductor layer 52, if any, together with the semiconductor layer 22 is enriched with germanium to a relatively higher level (e.g., approximately 20 to approximately 50 atomic % germanium). Thus, the germanium is selectively condensed into the semiconductor layer 22. As the germanium diffuses or otherwise migrates into the semiconductor layer 22, the germanium enters lattice sites within the semiconductor layer 22. In one embodiment, substantially all of the semiconductor layer 52 is consumed, wherein silicon from the semiconductor layer 52 is oxidized and germanium from the semiconductor layer 52 diffuses or otherwise migrates into the semiconductor layer 22.

After the oxidation, the semiconductor layer 22 includes a portion 64, which includes silicon and germanium, a portion 66, which includes silicon and substantially no germanium, and a portion 68. The portion 68 includes a germanium concentration gradient that varies as a distance from the portion 64 to the portion 66. Such a concentration gradient is undesired and will be subsequently removed. After the condensation, the lattice constant within the semiconductor layer is no greater than approximately 0.56 nm. The lattice constant causes the portion 64 to have a stress with respect to the insulating layer 14 that is different from the stress within portion 66 with respect to the insulating layer 14. The different stress may be different in polarity (tensile versus compressive), different in magnitude, or a combination thereof. In one embodiment, the portion 64 has a compressive stress, and the portion 66 has a tensile stress. Each of the stresses within portions 64 and 66 is at least approximately one GPa in magnitude.

Figure 6:
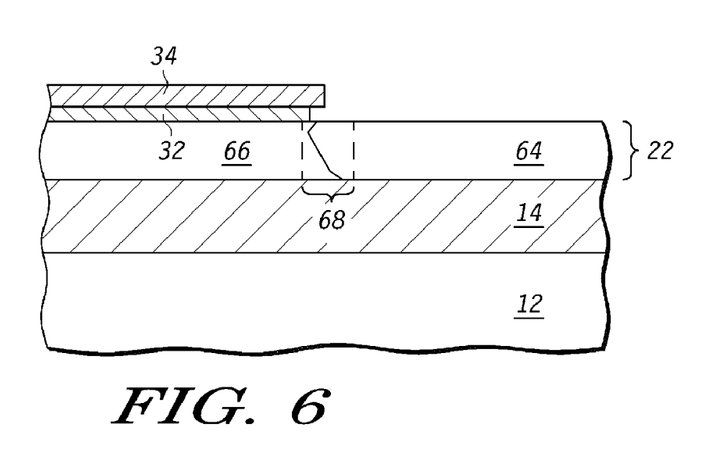
FIG. 6 includes an illustration of a cross-sectional view of the workpiece of FIG. 5 after removing an oxide layer formed during the oxidation.

Referring to FIG. 6, the oxide layer 62 and oxynitride layer 63 are removed using a conventional etching technique, such as etching using an HF solution. A portion of the pad layer 32 may be removed, however, such removal is relatively small and inconsequential.

Figure 7:
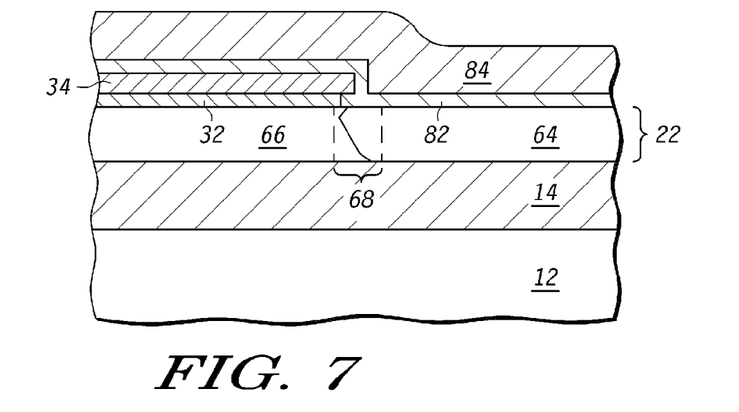
FIG. 7 includes an illustration of a cross-sectional view of the workpiece of FIG. 6 after forming another pad layer and a polish-stop layer.

Another pad layer 82 and a polish-stop layer 84 are formed over the oxidation mask 34, the remaining portion of the pad layer 32, and the semiconductor layer 22, as illustrated in FIG. 7. In one embodiment, the pad layer 82 includes an oxide (e.g., silicon dioxide) that is deposited over the semiconductor layer 22, and the polish-stop layer 84 includes a nitride (e.g., silicon nitride) that is deposited over the pad layer 82. In a particular embodiment, the pad layer 82 and the polish-stop layer 84 are deposited at a temperature no higher than approximately 1100° C. to reduce the likelihood that too much strain within different portions of the semiconductor layer 22 would be relieved. In one non-limiting embodiment, the pad layer 82 can have a thickness in a range of approximately 5 to approximately 20 nm, and the polish-stop layer 84 can have a thickness in a range of approximately 20 to approximately 200 nm.

Figure 8:
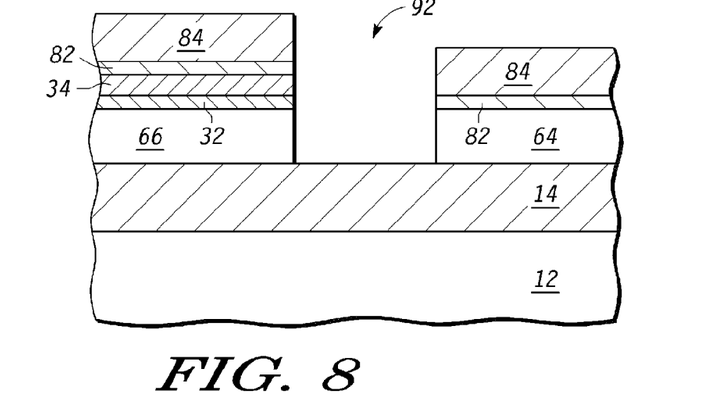
FIG. 8 includes an illustration of a cross-sectional view of the workpiece of FIG. 7 after patterning the pad layers, the oxidation-resistant layer, and the polish-stop layer for defining an opening where a field isolation region will be formed.

Portions of the polish-stop layer 84, pad layer 82, the oxidation-resistant layer 34, pad layer 32, and semiconductor layer 22 can be patterned using a conventional lithographic technique to define an opening 92, as illustrated in FIG. 8. A field isolation region will be subsequently formed within the opening 92. The portion 68, which had the lateral germanium concentration gradient, is removed, and therefore, active regions will not be formed over a portion of the semiconductor layer 22 having a lateral germanium concentration gradient. In an alternative embodiment, within opening 92, only part of the thickness of the semiconductor layer 22 is removed.

Figure 9:
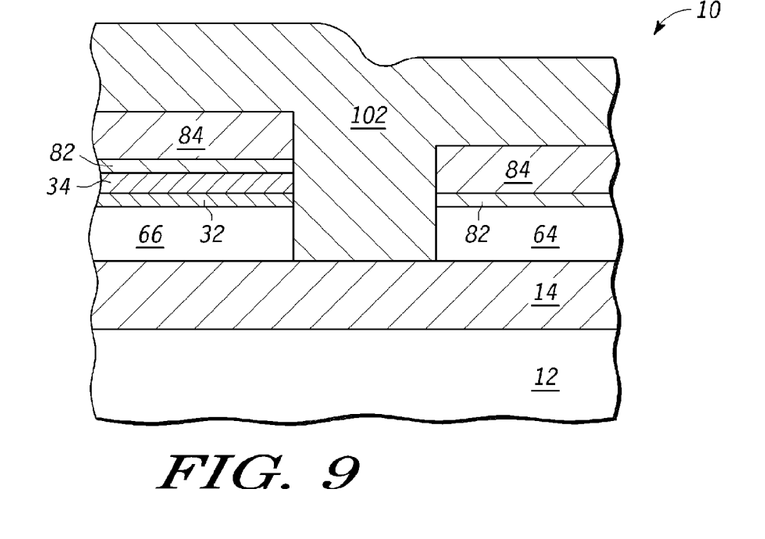
FIG. 9 includes an illustration of a cross-sectional view of the workpiece of FIG. 8 after filling the opening with an insulating layer.

An insulating layer 102 is formed over the workpiece 10, as illustrated in FIG. 9. In one embodiment, the insulating layer 102 includes an oxide (e.g., silicon dioxide) that is deposited to a thickness sufficient to completely fill the opening 92. In a particular embodiment, the insulating layer 102 is deposited at a temperature no higher than approximately 1100° C. to reduce the likelihood that too much strain within the semiconductor layer 22 would be relieved. In one non-limiting embodiment, the insulating layer 102 can have a thickness in a range of approximately 200 to approximately 2000 nm.

Figure 10:
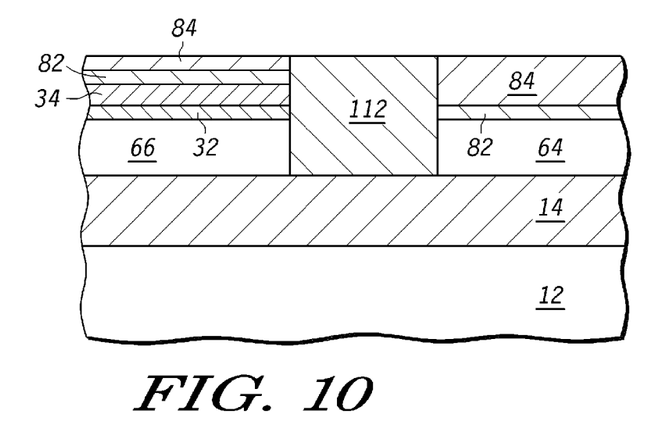
FIG. 10 includes an illustration of a cross-sectional view of the workpiece of FIG. 9 after removing a portion of the insulating layer outside the opening to form the field isolation region.

Portions of the insulating layer 102 lying outside the opening 92 are removed using a conventional chemical-mechanical polishing operation to form a field isolation region 112, as illustrated in FIG. 10. The polishing operation is performed such that it ends on the polish-stop layer 84. In another embodiment, the polishing operation could be continued until another layer underlying the polish-stop layer 84 is reached. In an alternative embodiment, the polish-stop layer 84 could be replaced by an etch-stop layer, and the conventional chemical-mechanical polishing operation could be replaced by a conventional etching technique, such as a resist-etch-back process.

Figure 11:
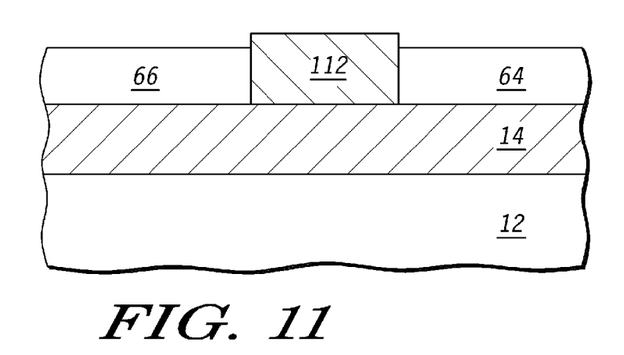
FIG. 11 includes an illustration of a cross-sectional view of the workpiece of FIG. 10 after removing the pad layers, the oxidation-resistant layer, and the polish-stop layer.

Remaining portions of the polish-stop layer 84, pad layer 82, oxidation-resistant layer 34, and pad layer 32 are removed, as illustrated in FIG. 11, using conventional techniques. The workpiece includes the substrate 12, the insulating layer 14, the portion 64 (including silicon germanium, compressive stress) of the semiconductor layer 22, the portion 66 (including silicon, tensile stress) of the semiconductor layer 22, and the field isolation region 112 between the portions 66 and 64.

At this point in the process, n-channel and p-channel transistors can be formed. In one embodiment, an n-channel transistor will have its active region (i.e., source/drain and channel regions) formed within the second portion 66 (tensile-stressed silicon), and a p-channel transistor will have its active region (i.e., source/drain and channel regions) formed within the first portion 64 (compressive-stressed silicon germanium). In this particular embodiment, during the formation of the n-channel and p-channel transistors, the processing temperatures are no greater than about 1170° C. to reduce the likelihood of relieving too much stress (i.e., relaxing the semiconductor materials within the first and second portions 64 and 66).

Figure 12:
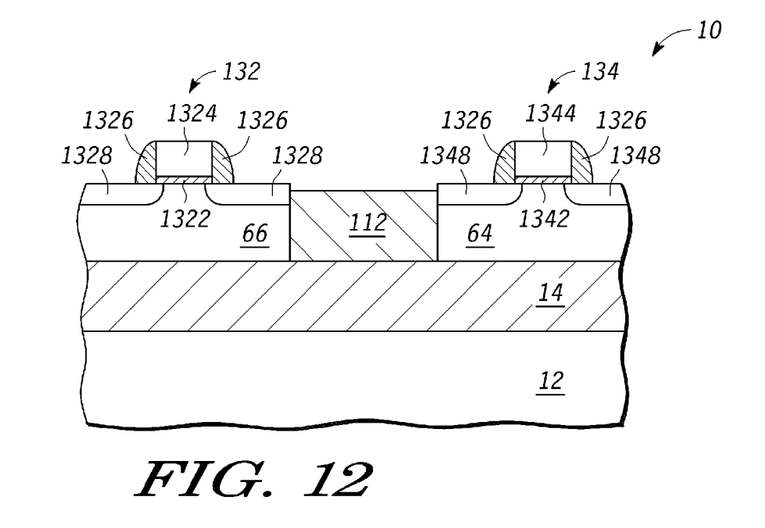
FIG. 12 includes an illustration of a cross-sectional view of the workpiece of FIG. 11 after forming n-channel and p-channel transistors.

One or more well dopants can be introduced into the first portion 64, the second portion 66, other portions (not illustrated), or any combination thereof. The dopants can allow for the formation for enhancement-mode transistors, depletion-mode transistors, or a combination thereof. Also, the well dopants can be used, in part, to determine the threshold voltages of the transistors being formed. In one non-limiting embodiment, the first portion 64 receives an n-type dopant, and the second portion 66 receives a p-type dopant. In other embodiments, one or both of the dopant types can be reversed, and in still another embodiment, the first portion 64, the second portion 66, or both may not receive a well dopant at this time, particularly if the semiconductor layer 22 included the proper dopant type and concentration for the first portion 64, the second portion 66, or both, as subsequently formed. An optional thermal cycle may be performed to activate the dopant(s). In another embodiment, the dopant(s) may be activated during subsequent processing A first gate dielectric layer 1342 and a second gate dielectric layer 1322 are formed over the first portion 64 and the second portion 66, respectively, as illustrated in FIG. 12. The first gate dielectric layer 1342 and the second gate dielectric layer 1322 may have the same or different compositions. Each of the first gate dielectric layer 1342 and the second gate dielectric layer 1322 may be thermally grown using an ambient including steam or oxygen, nitride oxide, or other suitable oxidizing species, or may be deposited using a conventional chemical vapor deposition technique, physical vapor deposition technique, atomic layer deposition technique, or a combination thereof. Each of the first gate dielectric layer 1342 and the second gate dielectric layer 1322 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_cN_d$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Each of the first gate dielectric layer 1342 and the second gate dielectric layer 1322 has a thickness in a range of approximately 5 to approximately 50 nm in a substantially completed electronic device.

A first gate electrode 1344 is formed over the first gate dielectric layer 1342, and a second gate electrode 1324 is formed over the second gate dielectric layer 1322. The first gate electrode 1344 and the second gate electrode 1324 may have the same or different compositions. Each of the first gate electrode 1344 and the second gate electrode 1324 can include one or more layers. In one particular embodiment, the first gate electrode 1344 has a layer closest to the first gate dielectric layer 1342, wherein such closest layer helps to establish the work function of the p-channel transistor being formed. In this particular embodiment, such closest layer within the first gate electrode 1344 can include $Ti_aN_b$, $Mo_aN_b$, $Mo_aSi_bN_c$, $Ru_aO_b$, $Ir_aO_b$, Ru, Ir, $Mo_aSi_bO_c$, $Mo_aSi_bO_cN_d$, $Mo_aHf_bO_c$, $Mo_aHf_bO_cN_d$, other suitable transition metal containing material, or any combination thereof. In another particular embodiment, the second gate electrode 1324 has a layer closest to the second gate dielectric layer 1322, wherein such closest layer helps to establish the work function of the n-channel transistor being formed. In this particular embodiment, such closest layer within the second gate electrode 1324 can include $Ta_aC_b$, $Ta_aSi_bN_c$, $Ta_aN_b$, $Ta_aSi_bC_c$, $Hf_aC_b$, $Nb_aC_b$, $Ti_aC_b$, $Ni_aSi_b$, other suitable material, or any combination thereof The first gate electrode 1344, the second gate electrode 1324, or any combination thereof can include a heavily doped amorphous silicon or polycrystalline silicon layer, a metal silicide layer, other suitable conductive layer, or a combination thereof that can be used in conjunction with or in place of the closest layers within the first and second gate electrodes 1344 and 1324 closest to the gate dielectric layers 1342 and 1322, respectively, as previously described. In another embodiment, one or more other layers could be present with the first gate electrode 1344 and the second gate electrode 1324. Each of the first and second gate electrodes 1344 and 1324 has a thickness in a range of approximately 50 to approximately 300 nm. An optional sidewall oxide or nitride layer (not illustrated) can be grown from exposed sides of the first and second gate electrodes 1344 and 1324 to protect the first and second gate electrodes 1344 and 1324 during subsequent processing.

Sidewall spacers 1326, n-type source/drain ("S/D") regions 1328, and p-type S/D regions 1348 can be formed. In one embodiment, dopants for extension regions can be implanted after forming the first and second electrodes 1344 and 1324 and before forming the sidewall spacers 1326. The sidewall spacers 1326 can be formed using conventional techniques and may include one or more oxide layers, one or more nitride layers, or a combination thereof. Dopants for heavily doped regions can be implanted after forming the sidewall spacers 1326. A thermal cycle can be performed to activate the dopants to form the n-type source/drain ("S/D") regions 1328, and p-type S/D regions 1348, which include extension and heavily doped regions. At this point in the process, an n-channel transistor 132 and a p-channel transistor 134 have been formed.

Although not illustrated in FIG. 12, silicided regions can be formed. More specifically, a metal-containing layer (not illustrated) is formed over the substrate 12. The metal-containing layer can include a material capable of reacting with silicon to form a silicide, and can include Ti, Ta, Co, W, Mo, Zr, Pt, other suitable material, or any combination thereof. In one embodiment, the metal-containing layer is formed using a conventional deposition technique. Exposed portions of the first and second gate 1344 and 1324 (if such exposed portions include polysilicon or amorphous silicon), the n-type S/D regions 1328, and the p-type S/D regions 1348 can react with the metal-containing layer to formed silicide regions. Portions of the metal-containing layer that overlie insulating materials (e.g., field isolation region 112, sidewall spacers 1326, etc.) do not significantly react with each other. Unreacted portions of the metal-containing layer are removed using a conventional technique.

Processing can be continued to form a substantially completed electronic device. One or more insulating layers, one or more conductive layers, and one or more encapsulating layers are formed using conventional techniques.

In an alternative embodiment, one or more other semiconductor elements can be used in conjunction with or in place of germanium. For example, the semiconductor layer 52 can be a carbon-doped silicon germanium layer or a silicon-germanium-carbon ternary compound. In still another embodiment, the semiconductor layer 22 and semiconductor layer 52 can include the same semiconductor elements, but in different ratios. During oxidation, the concentration of one semiconductor element may be increased relative the other semiconductor element(s).

In still another embodiment, the concepts may be extended to other materials. For example, a semiconductor element may diffuse or otherwise migrate from a layer other than a semiconductor layer. For example, a silicon-rich silicon nitride layer may be formed over a silicon germanium layer. During a thermal cycle, some of the silicon may from the silicon-rich silicon nitride layer may diffuse or otherwise migrate into the silicon germanium layer to increase the silicon content relative to the germanium content.

In a further embodiment, the concepts may be extended to other semiconductor materials. For example, a III-V semiconductor layer may include a Group 13 and a Group 15 element. A layer with another Group 13 element, another Group 15 element, or both may be formed over the III-V semiconductor layer. An oxidation or thermal cycle may be performed to allow the other Group 13 element, Group 15 element, or both to diffuse or otherwise migrate into the III-V semiconductor layer. The II-VI semiconductors may also be affected in a similar manner.

In one specific embodiment, the use of a silicon layer with tensile stress and a silicon germanium layer with compressive stress allows such silicon layer and silicon germanium layers to have different work functions and allow the stress to be used as a threshold voltage adjusting mechanism, similar to a well dopant, a threshold adjusting dopant, or any combination thereof.

By forming the field isolation region 112 after performing the oxidation for the selective condensation, a significant portion of the field isolation region 112 is not removed when removing the oxide layer 62 because the field isolation region 112 has not yet been formed. Therefore, problems related to eroding too much of the field isolation region 112 are reduced.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process for forming an electronic device can include forming an oxidation mask over a first layer overlying an insulating material, which can overlie a substrate. The first layer can include a first semiconductor element, the first layer can be strained, the first layer can have a first portion and a second portion, and the oxidation mask can overlie the first portion of the first layer and not the second portion of the first layer. The process can also include forming a second layer over the second portion of the first layer, wherein the second layer can include a second semiconductor element different from the first semiconductor element. The process can further include oxidizing a portion of the second layer, wherein during oxidizing, the second semiconductor element can migrate from the second layer into the second portion of the first layer and increase a concentration of the second semiconductor element within the second portion.

In one embodiment of the first aspect, after oxidizing the portion of the second layer, the first portion of the first layer has a first stress with respect to the insulating layer. The second portion of the first layer has a second stress with respect to the insulating layer, wherein the second stress is different from the first stress. In another embodiment, after oxidizing the portion of the second semiconductor layer, the first portion of the first layer has a tensile stress, and the second portion of the first layer has a compressive stress. In a particular embodiment, the second portion of the first layer has a lattice constant no greater than approximately 0.56 nm.

In another embodiment of the first aspect, after oxidizing, a third portion of the first layer lies between the first and second portions of the first layer. A concentration of the first semiconductor element within the third portion is between the concentration of the first semiconductor element within the first portion and the concentration of the first semiconductor element within the second portion. In another particular embodiment, the process further includes removing the third portion of the first layer to define an opening, and forming a field isolation region within the opening.

In a further embodiment of the first aspect, the process further includes forming an n-channel transistor within the first portion of the first layer, and forming a p-channel transistor within the second portion of the first layer. In still another embodiment, before forming the second layer, silicon is the only semiconductor element within the first layer, and forming the second layer includes forming the second layer including silicon and germanium over the second portion of the first layer, wherein the second semiconductor element is germanium.

In a second aspect, a process for forming an electronic device can include selectively condensing a first semiconductor element into a first portion of a first layer from a second layer. The first layer can include a second semiconductor element different from the first semiconductor element. The first layer can include a first portion, a second portion, and a third portion. The first portion can be spaced apart from the second portion and a concentration of the first semiconductor element within the first portion of the first layer remains substantially unchanged. The second portion can underlie the second layer and a concentration of the first semiconductor element within the second portion of the first semiconductor layer can increase during selectively condensing. A third portion can lie between the first and second portion. The process can also include removing the third portion to define an opening and forming a field isolation region that substantially fills the opening.

In one embodiment of the second aspect, after selectively condensing, the first portion of the first layer has a first stress with respect to the insulating layer, and the second portion of the first layer has a second stress with respect to the insulating layer, wherein the second stress is different from the first stress. In another embodiment, after selectively condensing, the first portion of the first layer has a tensile stress, and the second portion of the first layer has a compressive stress. In a particular embodiment, the second portion of the first layer has a lattice constant no greater than approximately 0.56 nm.

In still another embodiment of the second aspect, the process further includes forming an n-channel transistor within the first portion of the first layer, and forming a p-channel transistor within the second portion of the first layer. In yet another embodiment, the process further includes forming the first layer, wherein silicon is the only semiconductor element within the first layer as formed, and forming the second layer including silicon and germanium over the second portion of the first layer, wherein the first semiconductor element is germanium.

In a third aspect, an electronic device can include a substrate, an insulating layer over the substrate, a first semiconductor portion overlying the insulating layer, and a second semiconductor portion overlying the insulating layer. The first semiconductor portion can have a first stress with respect to the insulating layer. The second semiconductor portion can have a second stress with respect to the insulating layer, wherein the second stress is different from the first stress.

In one embodiment of the third aspect, the first semiconductor portion includes substantially none of a first semiconductor element, and the second semiconductor portion includes a significant concentration of the first semiconductor element. In another embodiment, the first semiconductor portion is spaced apart from the second semiconductor portion, the first semiconductor portion lies on the insulating layer, and the second semiconductor portion lies on the insulating layer. In a further embodiment, the first semiconductor portion has a tensile stress, and the second semiconductor portion has a compressive stress. In yet another embodiment, the second semiconductor portion has a lattice constant no greater than approximately 0.56 nm. In still another embodiment, the first semiconductor portion includes silicon and an active region of an n-channel transistor, and the second semiconductor portion includes silicon and germanium and an active of a p-channel transistor.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A structure during formation of an electronic device, the structure comprising:
    a substrate;
    an insulating layer over the substrate;
    a first semiconductor portion overlying the insulating layer, the first semiconductor portion comprises substantially none of a first semiconductor element; and
    a second semiconductor portion overlying the insulating layer, wherein the second semiconductor portion comprises a first concentration of the first semiconductor element; and
    a third semiconductor portion overlying the insulating layer and lying between the first and second semiconductor portions, wherein:
        the third semiconductor portion includes a concentration gradient of the first semiconductor element;
        the third semiconductor portion has a first region and a second region;
        the first region is closer to the first semiconductor portion than the second semiconductor portion;
        the second region is closer to the second semiconductor portion than the first semiconductor portion;
        each of the first region and the second region includes the first semiconductor element; and
        a concentration of the first semiconductor element within the first region is greater than a concentration of the first semiconductor element within the second region.

2. The structure of claim 1, wherein the concentration gradient is characterized as a function of a distance from the first semiconductor portion to the second semiconductor portion.

3. The structure of claim 1, wherein:
    the first semiconductor portion has a first stress with respect to the insulating layer; and
    the second semiconductor portion has a second stress with respect to the insulating layer, wherein the second stress is different from the first stress.

4. The structure of claim 1, wherein each of the first, second, and third semiconductor portions lies on the insulating layer.

5. The structure of claim 1, wherein
    the first semiconductor portion has a tensile stress; and
    the second semiconductor portion has a compressive stress.

6. The structure of claim 1, wherein the second semiconductor portion has a lattice constant no greater than approximately 0.56 nm.

7. The structure of claim 1, further comprising:
    an oxidation-resistant layer that overlies the first semiconductor portion and part of the semiconductor third portion, wherein substantially none of the oxidation-resistant layer overlies the second semiconductor portion; and
    a polish-stop layer that overlies the first, second, and third semiconductor portions.

8. The structure of claim 7, further comprising:
    a first pad layer that lies on the first semiconductor portion and part of the third semiconductor portion, wherein:
    substantially none of the first pad layer overlies the second semiconductor portion; and
    the oxidation-resistant layer and the polish-stop layer overlie the first pad layer; and
    a second pad layer that lies between the polish-stop layer and each of the first, second, and third semiconductor portions.

9. The structure of claim 1, wherein the first, second, and third semiconductor portions include silicon, and the first semiconductor element is germanium.

10. An electronic device comprising:
    a substrate;
    an insulating layer over the substrate;
    a first semiconductor portion abutting the insulating layer, wherein the first semiconductor portion comprises substantially none of a first semiconductor element, has a first stress with respect to the insulating layer, and the first stress has at a magnitude of at least approximately 1 GPa; and
    a second semiconductor portion abutting the insulating layer, wherein the second semiconductor portion comprises a significant concentration of the first semiconductor element, has a lattice constant no greater than approximately 0.56 nm, has a second stress with respect to the insulating layer, wherein the second stress is an opposite type of stress as compared to the first stress, and the stress has at a magnitude of at least approximately 1 GPa.

11. The electronic device of claim 10, wherein the first semiconductor element is germanium.

12. The electronic device of claim 10, wherein
    the first stress is a tensile stress; and
    the second stress is a compressive stress.

13. The electronic device of claim 10, wherein:
    the first semiconductor portion includes silicon and an active region of an n-channel transistor; and
    the second semiconductor portion includes silicon and germanium and an active of a channel transistor.

14. An electronic device comprising:
a substrate;
an insulating layer over the substrate;
a first semiconductor portion overlying the insulating layer, wherein the first semiconductor portion has a first stress with respect to the insulating layer;
a second semiconductor portion overlying the insulating layer, wherein the second semiconductor portion has a second stress with respect to the insulating layer, wherein the second stress is different from the first stress; and
a third semiconductor portion overlying the insulating layer and lying between the first and second semiconductor portions, wherein:
   the third semiconductor portion includes a concentration gradient of a first semiconductor element;
   the third semiconductor portion has a first region and a second region;
   the first region is closer to the first semiconductor portion than the second semiconductor portion;
   the second region is closer to the second semiconductor portion than the first semiconductor portion;
   each of the first region and the second region includes the first semiconductor element; and
   a concentration of the first semiconductor element within the first region is greater than a concentration of the first semiconductor element within the second region.

15. The electronic device of claim 14, wherein:
the first semiconductor portion comprises substantially none of a first semiconductor element; and
the second semiconductor portion comprises a significant concentration of the first semiconductor element.

16. The electronic device of claim 14, wherein:
the first semiconductor portion is spaced apart horn the second semiconductor portion;
the first semiconductor portion lies on the insulating layer; and
the second semiconductor portion lies on the insulating layer.

17. The electronic device of claim 14, wherein
the first semiconductor portion has a tensile stress; and
the second semiconductor portion has a compressive stress.

18. The electronic device of claim 14, wherein the second semiconductor portion has a lattice constant no greater than approximately 0.56 nm.

19. The electronic device of claim 14, wherein:
the first semiconductor portion includes silicon and an active region of an n-channel transistor; and
the second semiconductor portion includes silicon and germanium and an active of a p-channel transistor.

20. The electronic device of claim 10, further comprising a third semiconductor portion overlying the insulating layer and lying between the first and second semiconductor portions, wherein:
the third semiconductor portion includes a concentration gradient of a first semiconductor element;
the third semiconductor portion has a first region and a second region;
the first region is closer to the first semiconductor portion than the second semiconductor portion;
the second region is closer to the second semiconductor portion than the first semiconductor portion;
each of the first region and the second region includes the first semiconductor element; and
a concentration of the first semiconductor element within the first region is greater than a concentration of the first semiconductor element within the second region.

* * * * *

UNITED STATES PATENT AND TRADEMARK OFFICE
CERTIFICATE OF CORRECTION

| | | |
|---|---|---|
| PATENT NO. | : 7,821,067 B2 | |
| APPLICATION NO. | : 11/836844 | |
| DATED | : October 26, 2010 | |
| INVENTOR(S) | : Voon-Yew Thean et al. | |

It is certified that error appears in the above-identified patent and that said Letters Patent is hereby corrected as shown below:

Column 12, Line 67, please change "a channel transistor" to --a p-channel transistor--

Column 13, Line 35, please change "spaced apart horn" to --spaced apart from--

Signed and Sealed this
Eleventh Day of October, 2011

David J. Kappos
*Director of the United States Patent and Trademark Office*